United States Patent
Sundaram et al.

(10) Patent No.: US 7,117,424 B2
(45) Date of Patent: Oct. 3, 2006

(54) BLOCK CODING METHOD HAVING INCREASED FLEXIBILITY IN CHOICE OF CODE LENGTH OR MINIMUM CODE DISTANCE

(75) Inventors: Ganapathy Subramanian Sundaram, Hillsborough, NJ (US); Kartik Swaminathan Venkatram, Morristown, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 416 days.

(21) Appl. No.: 10/144,473

(22) Filed: May 13, 2002

(65) Prior Publication Data

US 2003/0212945 A1 Nov. 13, 2003

(51) Int. Cl.
*H03M 13/00* (2006.01)
(52) U.S. Cl. .................................... 714/781; 714/776
(58) Field of Classification Search ................ 714/781, 714/746, 784, 752, 776; 360/53; 708/492
See application file for complete search history.

(56) References Cited

U.S. PATENT DOCUMENTS

| | | | | |
|---|---|---|---|---|
| 4,979,174 A | * | 12/1990 | Cheng et al. | 714/774 |
| 5,363,107 A | * | 11/1994 | Gertz et al. | 342/26 R |
| 5,768,296 A | * | 6/1998 | Langer et al. | 714/784 |
| 6,038,577 A | * | 3/2000 | Burshtein | 708/252 |
| 6,484,192 B1 | * | 11/2002 | Matsuo | 708/492 |
| 6,611,597 B1 | * | 8/2003 | Futa et al. | 380/30 |
| 6,628,728 B1 | * | 9/2003 | McCarty, Jr. | 375/296 |
| 6,671,709 B1 | * | 12/2003 | Glaser et al. | 708/492 |
| 6,721,771 B1 | * | 4/2004 | Chang | 708/492 |
| 6,728,052 B1 | * | 4/2004 | Kondo et al. | 360/53 |

* cited by examiner

*Primary Examiner*—Guy Lamarre
*Assistant Examiner*—Mujtaba K. Chaudry
(74) *Attorney, Agent, or Firm*—M. I. Finston

(57) ABSTRACT

In a method of block coding, each character of the codeword may be thought of as a sum of characters of the message word, computed such that each message-word character that contributes to the sum is weighted by a respective weight coefficient. In the method described here, the weight coefficients are derived from a division polynomial of an elliptic curve.

10 Claims, 2 Drawing Sheets

BLOCK CODING METHOD HAVING INCREASED FLEXIBILITY IN CHOICE OF CODE LENGTH OR MINIMUM CODE DISTANCE

FIELD OF THE INVENTION

This invention relates to block codes for adding redundancy to transmitted signals. More particularly, the invention relates to block codes that are, or are similar to, linear block codes and have cyclic, or other group-theoretic properties.

ART BACKGROUND

It has long been known that when a message word in the form $m=(m_1, m_2, \ldots, m_k)$ is to be sent over a noisy channel, recovery of the message at the receiving end of the channel can be enhanced by adding redundancy to the transmitted message. In one well-known approach, m is subjected, before transmission, to a linear transformation, thereby to produce a codeword $c=(c_1, c_2, \ldots, c_n)$, in which the total number n of characters $c_i$ in the codeword is greater than the total number k of characters in the message word. The codeword, which incorporates desired redundant information, is transmitted over the channel and decoded at the receiving end.

Each character $c_i$ of the codeword is a weighted sum of characters of the corresponding message block. The respective weight coefficients can be expressed in the form of, for example, an n×k matrix. At the receiving end, the decoder uses the coding matrix, or equivalent information, in conjunction with well-known techniques to recover the transmitted message word.

Some examples of linear block codes are Reed-Solomon, BCH, Golay, Goppa, and Hamming codes.

One measure of the effectiveness of a linear code is the minimum code distance. Roughly speaking, the minimum code distance measures the amount of corruption a received codeword can sustain without being mistaken for a different codeword. In mathematical terms, the codewords of a given code are pictured as an array of points in an abstract mathematical space. Associated with the space is a measure of distance between pairs of points. One such distance measure is the well-known Hamming distance. With reference to such a space and such a distance measure, the minimum code distance is related to the separation between the closest pair of codewords.

Linear codes are typically characterized in terms of three values: the code length n, the message length k, and the minimum distance d. In linear codes of the prior art, however, it has not generally been possible to make independent selections of n, k, and d. For example, a primitive BCH code will be completely determined by the designed minimum distance d and the finite alphabet from which the message characters $m_i$ are to be selected. Since a Reed-Solomon code is a special case of a primitive BCH code, it will have the same property. (It should be noted that the message alphabet is often the binary alphabet $\{0, 1\}$.)

Thus, there has been a need for linear codes that can be designed with greater flexibility. There is a general requirement, known as the "singleton bound,", that d can never be greater than $n+k-1$. However, given a message alphabet, there has been a need for codes that can be designed, within the constraint imposed by the singleton bound, with greater independence among the choices of n, k, and d.

SUMMARY OF THE INVENTION

We have found a new method for designing linear block codes, which leads to hitherto unknown codes. Importantly, our design method will generally provide, for a given choice of alphabet, code length, and message length, a range of distinct codes, each having its own distance properties. Moreover, the codes produced by our design method have group-theoretic properties, analogous to those of, e.g., Reed-Solomon and BCH codes, which can simplify the computation or estimation of minimum code distance, and could lead to efficient decoding algorithms.

The design procedure for our new codes makes reference to a mathematical construction known as an elliptic curve. Those practiced in algebraic geometry will appreciate that there is an addition rule associated with elliptic curves. Under that rule, any two selected points on an elliptic curve can be summed to produce a third point which also lies on the same curve. A "point at infinity" is also considered to belong to each elliptic curve. The point at infinity is the identity element under the addition rule, and thus bears an analogy to zero as the identity element in ordinary addition. Below, the point at infinity will be denoted 0.

Under the addition rule, every point of an elliptic curve will exhibit cyclic behavior. That is, for every point on the curve there exists a positive integer $\mu$ such that when the point is added to itself $\mu$ times, the resulting sum will equal the identity element 0. Such a point is referred to as a $\mu$ torsion point. Thus, P is a $\mu$ torsion point if $P+P+\ldots+P=0$, and P occurs $\mu$ times in the just-stated sum. Such a sum is written $\mu P$, and referred to as the scalar product of $\mu$ times P.

By applying known methods, it is possible to state, for a given elliptic curve, a polynomial whose roots identify the $\mu$-torsion points. Such a polynomial is referred to as a division polynomial of order $\mu$.

In a broad aspect, our invention involves a coding method, which comprises obtaining as input a message word consisting of a finite sequence of characters, and applying a linear transformation to the message word, thereby to produce as output a codeword consisting of a finite sequence of characters. Each character of the codeword is a sum of characters of the message word, computed such that each message-word character that contributes to said sum is weighted by a respective weight coefficient. The weight coefficients are derived from a division polynomial of an elliptic curve.

DEFINITIONS

Figure 1:
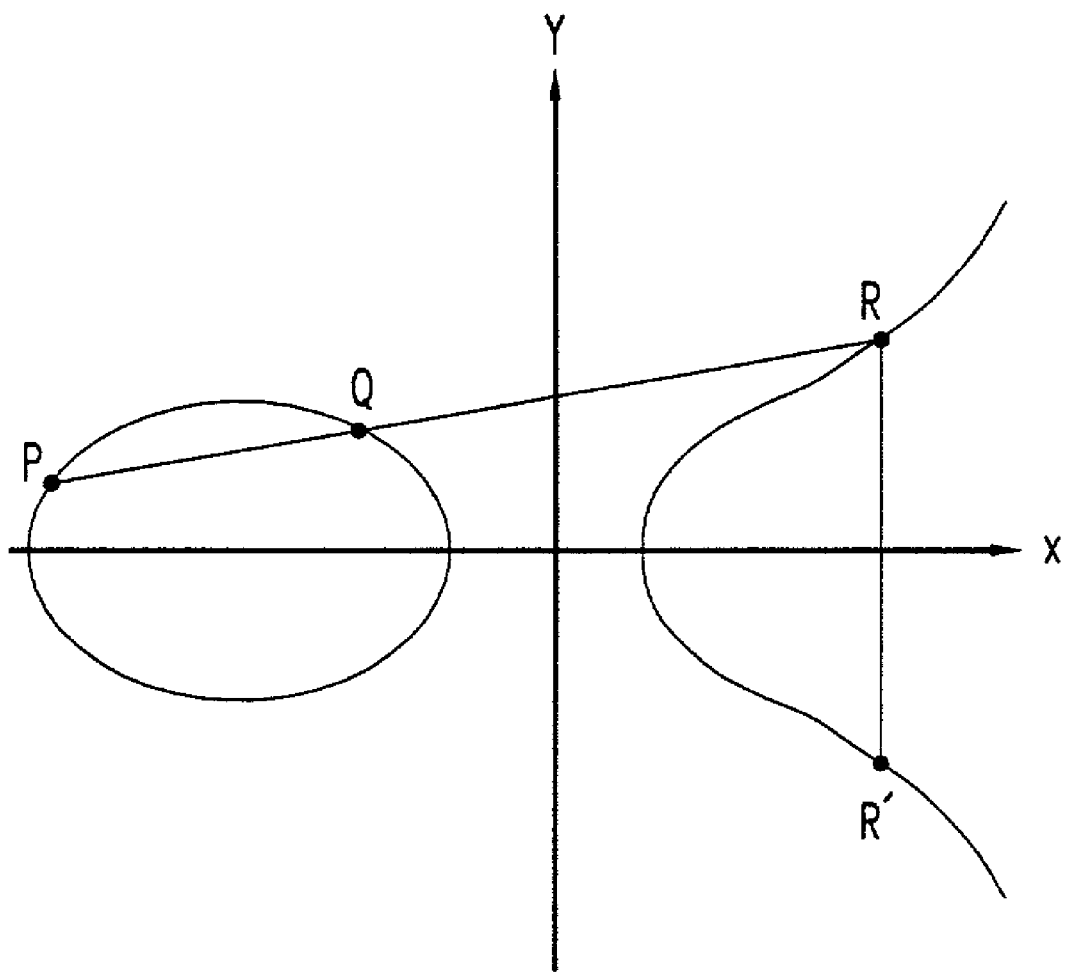
FIG. 1 is a graph of a typical elliptic curve defined over the field of real numbers and graphed in the Euclidean plane.

A mathematical group is a set of elements together with a binary operation, here denoted "+". The binary operation must satisfy the following: (a) If x and y are elements of the group, then x+y is also an element of the group. That is, the group is closed under the operation "+". (b) There exists some element of the group, here denoted "0", for which, given any element x of the group, x+0=x. (c) For every element x of the group, there exists an element y of the group for which $x+y=y+x=0$. (d) For any three elements x, y, z of the group, the operation "+" must have the associative property that $x+(y+z)=(x+y)+z$.

A mathematical ring is a set of elements together with two binary operations, which we refer to as ring addition and ring multiplication, and denoted by "+" and "×", respectively. The set is closed under both of these operations. The operations must satisfy: (a) The set is a group under ring addition. (b) $x+y=y+x$ for all pairs x, y of elements of the set. That is, ring addition is commutative. (c) $(x\times y)\times z=x\times(y\times z)$ for all three-tuples x, y, z of elements of the set. (d) $x\times(y+z)=(x\times y)+(x\times z)$ for all three-tuples x, y, z of elements of the set.

A mathematical field is a ring having the following further properties: (a) the ring is a group under the operation of ring addition. (b) Exclusive of the 0 element, the ring forms a group under ring multiplication. (c) the product of the 0 element with any element of the ring, under ring multiplication, is 0. (d) Addition and multiplication in a field are both commutative. The field addition and multiplication operations are analogous to ordinary addition and multiplication of real numbers, except that it is possible for a field to have only a finite number of elements.

The characteristic $\chi$ of a ring or field is the least positive integer for which, given any element x of the ring or field, $x+x+\ldots+x=0$, where x is taken $\chi$ times in the just-stated sum.

Given a ring R, an ideal I of R is a subring of R, i.e., a subset of R which itself forms a ring, which has at least one of the following properties: (a) For all elements i of I and all elements r of R, ri is an element of I. (b) For all elements i of I and all elements r of R, ir is an element of I.

In a restricted sense, an elliptic curve over a field K is a curve of the form $$y^2+a_1xy+a_3y=x^3+a_2x^2+a_4x+a_6,$$

to which is also appended a point at infinity, here denoted 0, and in which x and y and the coefficients $a_1$, $a_2$, $a_3$, $a_4$, and $a_6$ are elements of the field K. The field K may be a finite field; that is, it may have only a finite number of elements. The above definition will be sufficient to impart an understanding of the principles of the present invention. A fuller definition can be found in many well-known references, such as J. Silverman, *Arithmetic of Elliptic Curves*, Springer-Verlag, 1986.

A block code having codewords $(c_1, c_2, \ldots, c_n)$ is said to be linear if the coefficients $c_1, c_2, \ldots, c_n$ belong to a field, the sum of any two codewords is a codeword, and the ordered n-tuple $(0, 0, \ldots, 0)$ is a codeword.

Mathematical Observations

A. Relationship Between Products of Polynomials and Linear Transformations

Consider the polynomials $a=a_2x^2+a_1x+a_0$ and $b=b_2x^2+b_1x+b_0$. The product of these polynomials is $$c=a_2b_2x^4+(b_2+a_2b_1)x^3+(a_2b_0+a_1b_1+a_0b_2+(a_1b_0+a_0b_1)x+a_0b_0.$$

Write each of the original two polynomials as a vector, in which the power of x is implied from position within the vector. That is, write the polynomials, respectively, as $a=(a_2\ a_1\ a_0)$ and $b=(b_2\ b_1\ b_0)$. Then in like manner, their product is readily written as $$c=(a_2b_2\ a_2b_1+a_1b_2\ a_2b_0+a_1b_1+a_0b_2\ a_1b_0+a_0b_1\ a_0b_0).$$

It will be appreciated that each of the five terms of the product vector is a weighted sum of the elements of a, in which each of the weight coefficients is an element of b. That is, the product vector c is obtained from a linear transformation of a, which may be represented in matrix form by $c=Ba$, where B is given by:

$$B = \begin{bmatrix} b_2 & 0 & 0 \\ b_1 & b_2 & 0 \\ b_0 & b_1 & b_2 \\ 0 & b_0 & b_1 \\ 0 & 0 & b_0 \end{bmatrix}$$

Those skilled in the art will appreciate that multiplication of any polynomial a, of any degree, by a second polynomial b, also of any degree, can be analogously represented in matrix form as a linear transformation of a.

B. Group Behavior of Elliptic Curves

FIG. 1 is a graph of a typical elliptic curve over the field of real numbers. This graph is provided purely for the pedagogical purpose of illustrating a group property of the points on an elliptic curve. It should be borne in mind that in the example which follows below, and in many related instances, the elliptic curve is taken not over the real numbers, but over a finite field. In such cases, even though the group property to be described below still obtains, the elliptic curve has an abstract nature that is not accurately reflected by the graphical representation of FIG. 1.

FIG. 1 further illustrates an addition rule for points lying on elliptic curves. This rule will be familiar to those learned in the principles of algebraic geometry. Every straight line drawn through a point of the elliptic curve will, in fact, intersect the curve at three points. If the straight line is tangent to the curve at any point, the point of tangency is counted as two points of intersection. The point at infinity is counted as a possible point of intersection. Given two points P and Q lying on the elliptic curve, the sum P+Q according to the addition rule is obtained by drawing a straight line through P and Q and extending it to its third intersection R with the elliptic curve. (The sum P+P is obtained by drawing the tangent at P and extending it to R.) The sum P+Q is the reflection R' of R in the x-axis.

From the above geometric description, those skilled in the art will find it easy to write down an explicit algebraic formula for the addition rule. An explicit formula can also be found in any of many well-known reference works, including book by J. Silverman, cited above. In the discussion below, we will provide an explicit formula for a special case of the addition rule.

As noted above, the points P of the elliptic curve for which the product μP equals 0 are referred to as μ-torsion points. The total number of μ-torsion points on a given elliptic curve, including the point at infinity, is $\mu^2$. However, it should be recalled that the elliptic curve is taken over a given field K. The number of μ-torsion points (x, y) for which x and y are elements of K may be less than $\mu^2$.

C. Binary Fields

The characteristic of a field must be a prime number. (It should be noted that the characteristic of a ring need not be a prime number.) For every choice of characteristic p and integer r, there exists one and only one field $\Phi_q$ having $q=p^r$ elements.

As is well known in the art, the field $\Phi_2$ consists of the binary set {0, 1}, together with the following addition and multiplication tables:

| + | 0 | 1 |
|---|---|---|
| 0 | 0 | 1 |
| 1 | 1 | 0 |

| × | 0 | 1 |
|---|---|---|
| 0 | 0 | 0 |
| 1 | 0 | 1 |

The characteristic of $\Phi_2$ is 2, because either element, added to itself, gives a sum of 0. We have adopted the term "binary field" to denote any field of characteristic 2. It should be noted that this terminology has been adopted here for convenience, and does not necessarily reflect the terminology to be found in the published literature.

Another binary field is $\Phi_4$, which consists of elements a, b, c, d, together with the following addition and multiplication tables:

| + | a | b | c | d |
|---|---|---|---|---|
| a | a | b | c | d |
| b | b | a | d | c |
| c | c | d | a | b |
| d | d | c | b | a |

| × | a | b | c | d |
|---|---|---|---|---|
| a | a | a | a | a |
| b | a | b | c | d |
| c | a | c | d | b |
| d | a | d | b | c |

The above addition table shows that element a is the identity element for addition, and that any element, added to itself, gives a sum of a. Thus, the characteristic of $\Phi_4$ is 2. The elements a, b, c, d can be identified with the binary pairs (0, 0), (0, 1), (1, 0), and (1, 1), respectively. When that identification is made, it becomes clear that the addition operation represented in the above addition table is ordinary vector addition, modulo 2. Those skilled in the art will appreciate that there are extensions to $\Phi_q$, where $q=2^r$ and r is any integer, in which each element of the field can be identified with a binary r-tuple, and the addition operation remains ordinary vector addition modulo 2. Because of the properties of addition modulo 2, any such field will be "binary" according to our usage of that term.

DETAILED DESCRIPTION OF AN ILLUSTRATIVE EMBODIMENT

Figure 2:
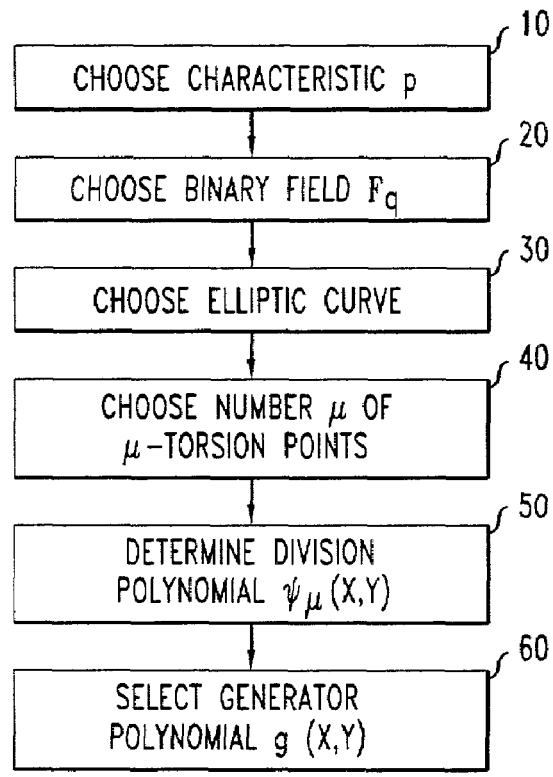
FIG. 2 is a flowchart of a code-generation procedure according to the invention in an illustrative embodiment.

FIG. 2 is a flowchart of a procedure for creating a code according to the principles of our invention. At block 10, a characteristic p is chosen. As noted above, the characteristic p must be a prime number. In the specific example to be illustrated below, p is equal to 2.

At block 20, a chosen field $\Phi_q$ is determined by selecting the integer r. The number of elements of the field is $q=p^r$. As explained above, the choice of p and r completely determines the field, and thus determines the message alphabet. In the specific example to be illustrated below, q=2 and r=1, and thus the selected field is the binary field $\Phi_2$.

At block 30, a particular elliptic curve over $\Phi_q$ is selected. In the specific example to be illustrated below, the selected elliptic curve is defined by the equation $y^2+y=x^3+x$. Reference to the addition and multiplication tables for $\Phi_2$ will show that over that field, the points of this curve are (0, 0), (0, 1), (1, 0), and (1, 1), as well as the point 0. It will be understood that by, for example, the ordered pair (0, 0) is meant the point whose x-coordinate is 0 and whose y-coordinate is 0.

Reference to the addition and multiplication tables for $\Phi_4$ will show that over that field, the points of this curve are (a, a), (a, b), (b, a), and (b, b), as well as the point 0. Because a and b have the same addition and multiplication properties as the elements 0 and 1 of $\Phi_2$, those skilled in the art will appreciate that the points (a, a), (a, b), (b, a), and (b, b) are equivalent to the points (0, 0), (0, 1), (1, 0), and (1, 1) as embedded in the field $\Phi_4$.

At block 40, the number μ of desired μ-torsion points is selected. This number is also the order μ of the corresponding division polynomial $\psi_\mu(X, Y)$. The possible choices for μ are limited by the requirement that the characteristic p must not be a divisor of μ. Otherwise, the division polynomial (see below) will have repeated roots; that is, it will be "non-separable." Non-separability is disfavored because it generally leads to codes that perform poorly.

At block 50, the division polynomial $\psi_\mu(X, Y)$ is determined.

At block 60, a polynomial which divides $\psi_\mu(X, Y)$ is selected. This polynomial is here denominated the generator polynomial $g(X, Y)$ of the code. The degree of $g(X, Y)$ in x will be less than the degree of $\psi_\mu(X, Y)$ in x by an integer amount k'. This difference will relate to the length of the message words in the following respect: The sequence of individual characters that make up each message word corresponds to a polynomial over the selected field $\Phi_q$. As explained above, the coefficients of this polynomial are the respective characters of the message word. This polynomial is of maximum degree k'−1 in x, and of maximum degree 1 in y. Therefore, the maximum number of terms in this polynomial (and hence the maximum number of characters in the message word) is k'−1 (terms in non-zero powers of x)+k'−1 (terms in y times a non-zero power of x)+1 (term in y)+1 (constant term)=2 k'.

Figure 3:
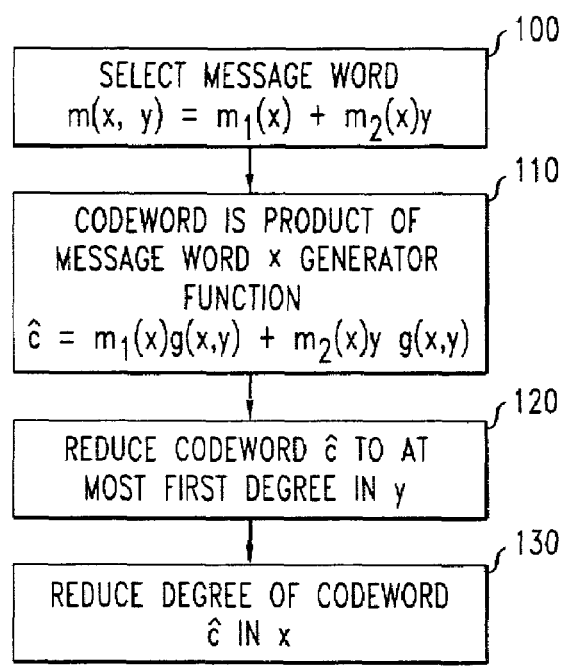
FIG. 3 is a flowchart of an encoding procedure according to the invention in an illustrative embodiment.

The code is defined by the choice of generator polynomial $g(X, Y)$. This is conveniently explained with reference to FIG. 3. At block 100 of FIG. 3, a message word is selected. The message word is any expression of the form $m_1(x)+m_2(x)y$, where $m_1(x)$ and $m_2(x)$ are any selected polynomials in x having coefficients in $\Phi_q$, subject only to the requirement that the degrees of the respective polynomials must be no more than k'−1. Given a message word m, the first step to obtain a corresponding code word c is to take the product $\hat{c}=m_1(x)g(x,y)+m_2(x)yg(x,y)$, as indicated at block 110. Then, the degree of ĉ is reduced according to the procedure indicated at blocks 120–130.

At block 120, ĉ is reduced to at most first degree in y. In this procedure, use is made of the fact that the equation defining the selected elliptic curve is quadratic in y. Thus, a term that is first-order in y can be substituted for every second-order term. For example, the elliptic curve used in the specific example illustrated below is defined by the equation $y^2+y=x+x$. According to this equation, every occurrence of $y^2$ can be replaced with $x^3+x-y$. (It should be noted in this regard that for arithmetic in binary fields, subtraction is equivalent to addition.) By repeatedly making such substitutions, c is reduced to a polynomial of no more than first degree in y. In block 120, we refer to this procedure as taking the quotient of c over the elliptic-curve equation.

At block 130, the quotient obtained in block 120 is further reduced to a degree in x that is less than the degree in x of $\psi_\mu(X, Y)$. If the selected field $\Phi_q$ is binary, it will be possible to express $\psi_\mu(X,Y)$ as a polynomial in x only. In that case, the equation $\psi_\mu(X, Y)=0$ readily yields a substitution of a sum of lower-order terms for the highest power of x in $\psi_\mu(X, Y)$. As above, repeated substitution will ultimately yield a polynomial of the desired reduced order. In block 130, we refer to this procedure as taking the quotient over the division polynomial. The output of blocks 120 and 130 is the codeword c.

Even if the selected field is not binary, the leading term of $\psi_\mu(X, Y)$ will often involve a power of x only, so that substitution of a sum of lower-order terms can readily be made as above. In the most general case, there are well-known techniques, based on the theory of Groebner bases, for obtaining a polynomial of the desired reduced order. Such techniques are described, for example, in D. Cox, J. Little, and D. O'Shea, *Ideals, Varieties, and Algorithms,* Springer-Verlag, New York, 1992.

When adding and multiplying coefficients of the polynomials, the addition and multiplication tables for the selected field must be obeyed.

It should be noted that a consistent ordering must be chosen for the terms of a polynomial in x and y. Those skilled in the art will appreciate that several alternative orderings are know to be useful in this regard. One such ordering is the so-called lexicographic ordering, in which: (a) the constant term comes first; (b) next come the terms in powers of x only, beginning with the lowest; (c) next come mixed powers of x and y; and (d) last come the terms in powers of y only, beginning with the lowest. As between two terms in mixed powers $x^m y^n$ and $x^{m'} y^{n'}$ of x and y, the applicable rules, in order of precedence, are: (a) the term in the greater of m and m' comes first; and (b) the term in the greater of n and n' comes last.

When drawing a correspondence between a codeword c as a polynomial, and the same codeword c as a vector, the order of the coefficients is typically maintained.

As noted above, the individual characters of the message word and of the codeword are drawn from an alphabet. If the alphabet corresponds to $\Phi_2$, these characters are advantageously sent as binary bits. If the alphabet contains more than two characters, then each character may, for example, be sent as an n-tuple of binary bits, or it may be sent using a multilevel code, or in one of many other forms known to those in the art for sending characters selected from non-binary alphabets.

In a specific, illustrative example, the selected field is $\Phi_2$, and the selected elliptic curve is $y^2+y=x^3+x$. Over the selected field, this curve has five points, including the point at infinity.

The addition rule for the selected elliptic curve over the selected field reduces to the following, for $P_1=(x_1, y_1)$, $P_2=(x_2, y_2)$, $P_3=(x_3, y_3)=P_1+P_2$:

(a) If $P_2=(x_1, y_1+1)$, $P_3$ equals 0.
(b) If $P_1 \neq P_2$, then $$\lambda = \frac{y_1 + y_2}{x_1 + x_2}.$$

(c) If $P_1=P_2$, then $\lambda=x_1^2+1$.
(d) $x_3=\lambda^2+x_1+x_2$; $y_3=\lambda(x_1+x_3)+y_1+1$.

As noted above, addition brings about the same result as subtraction for any binary field. Thus, in particular, addition in $\Phi_2$, which is addition modulo 2, has the property that adding an increment of unity (i.e., +1) brings about the same result as subtracting a unity increment.

Next, letting $\mu=5$, we will find the 5-division polynomial $\psi_5(X, Y)$, in the expectation that all five points of the elliptic curve will be among the twenty-five 5-torsion points of the curve. By definition, a point $P=(x, y)$ of the curve is a 5-torsion point if $5P=0$, where the multiplication by 5 is scalar multiplication. The preceding expression can be rewritten as $-P=4P$.

By application of the addition rules, $-P$ is found to equal $(x, y+1)$, and $4P$ is found to equal $(x^{16}, x^{24}+x^{12}+x^8+x^6+x^4+x^3+x^2+x+y+1)$. The x-component of $-P$ is subtracted from the x-component of $4P$ to obtain a polynomial expression that is set equal to zero, and similarly for the y-components of $-P$ and $4P$. Each of the resulting polynomial expressions is then factored over the field 42. The result is that for the x-components, $$0=x(x+1)(x^2+x+1)(x^4+x+1)(x^4+x^3+1)(x^4+x^3+x^2+x+1)$$

and for the y-components, $$0=x(x+1)^2(x^2+x+1)(x^3+x+1)(x^4+x^3+1)(x^4+x^3+x^2+x+1)(x^8+x^7+x^3+x^2+1)$$

The common solution of the just-preceding two equations is the desired 5-division polynomial; that is, $$\psi_5(x)=x(x+1)(x^2+x+1)(x^4+x^3+1)(x^4+x^3+x^2+x+1)$$

The above polynomial is a polynomial in x only. This will often be the case for the $\mu$-division polynomial when the elliptic curve is defined over a binary field. It will always be the case when the field is binary and the elliptic curve conforms to what is referred to as "Weierstrass" form. There is an advantageous computational simplification when the $\mu$-division polynomial is a polynomial in x only.

We now construct the code. For g(x), we can take any divisor of $\psi_5(x)$. Here, we choose $g(x)=x(x+1)(x^2+x+1)=x^4+x$. The degree of g(x) is less than the degree of $\psi_5(X,Y)$ by the integer amount k'=8. Consequently, the sequence of individual characters that make up each message word will correspond to a polynomial m(x,y) over $\Phi_2$ of maximum degree 7 in x, and of maximum degree 1 in y. Therefore, the maximum number of terms in this polynomial m(x,y) (and hence the maximum number of characters in the message word) is 16.

The code, then, consists of all polynomials over $\Phi_2$ of the form m(x,y)g(x). The code length is 24. This length is obtained by counting 12 terms in powers of x only, including a constant term (zeroeth power of x), and a like number of terms in y.

Those skilled in the art will appreciate that the code described above is the ideal generated by g(x) in the quotient ring $\Phi_2[X, Y]/(E, \psi_5(X,Y))$, where $\Phi_2[X, Y]$ is the field of polynomials over $\Phi_2$, and E is the selected elliptic curve.

The example provided above is illustrative only, and not meant to be limiting. For example, numerous other elliptic curves can be selected, and numerous fields, both binary and non-binary, other than $\Phi_2$ can be selected.

Letting E represent any selected elliptic curve, and letting K represent any selected field, the concepts described above can be generalized further by letting the code be any ideal in the quotient ring $K[X, Y]/(E, \psi_\mu(X,Y))$, where $\mu$, as before, is a selected order for the $\mu$-torsion points and the corresponding division polynomial. In this more general case, it will typically be necessary to define an ordering on the monomials—i.e., on the single-term expressions—in the quotient ring. Such an ordering is readily defined using well-known techniques from Groebner basis theory. Such techniques are described, for example, in D. Cox et al., *Ideals, Varieties, and Algorithms*, Springer-Verlag, New York, 1992.

In one example of code design, a µ-torsion point P is selected, and the set of the first d scalar, integer multiples {P, 2P, . . . , dP} is taken. The positive integer d is advantageously selected to be a desired minimum code distance for the resulting code. The designed code is the ideal corresponding to the set of d points described above. As is well known, every ideal is generated by a finite set of polynomials. The generator polynomials for the designed code are readily found by applications of Groebner basis theory. The codewords are formed by taking products of message strings with generator polynomials and summing the products. In preliminary studies, we have found that codes designed in this manner tend to have a minimum code distance that is greater than d.

Even more generally, the code can be defined over a ring rather than a field. As noted above, a code defined over a ring which is not a field is, strictly speaking, a nonlinear code. Given a linear code defined as the ideal I in the quotient ring $\Phi_p[X, Y]/(E, \psi_\mu(X,Y))$, a new, generally non-linear code can be defined by a procedure known as "lifting." The theoretical basis for lifting is provided by a well-known theorem known as Hensel's Lemma.

Define q, as above, as the integer $p^r$, where p is the characteristic of the field $\Phi_p$, and r is a positive integer. Generalize the elliptic curve E by now defining it over the ring $Z_q$. The ring $Z_q$ has the structure of the integers 0, 1, . . . , (q–1), modulo q. It should be noted that a modular mapping from $Z_q$ to $\Phi_p$ is defined by identifying with each $x \in \Box_q$ an image in $\Phi_p$ obtained by taking x modulo p.

The generalized curve is here denominated $E_q$. The coefficients of the equation defining the original elliptic curve E are replaced by the corresponding elements of $Z_q$. The coefficients of $E_q$ will reduce to the coefficients of E when the coefficients are taken modulo p.

Find the µ-division polynomial $$\psi_\mu^{(q)}(X, Y)$$

of $E_q$ over the ring $Z_q$. An application of Hensel's Lemma will lead to a generator polynomial $g_q(x,y)$ which divides $$\psi_\mu^{(q)}(X, Y),$$

and which transforms back to the generator function for I when its coefficients are taken modulo p. The lifted code is the ideal generated by $g_q(x,y)$ over the quotient ring $$Z_q[X, Y]/(E_q, \psi_\mu^{(q)}(X, Y)).$$

The pertinent mathematical procedures, deriving from Hensel's Lemma, are described, for example, in F. P. Gouvea, *p-adic Numbers: an Introduction*, 2d Ed., Springer-Verlag, 1997.

Even in the general cases described above, the codes described here are readily decoded using any standard algorithm for decoding linear codes. To make it effective, the decoder is provided the parameters used for encoding the message.

The following explicit formulas will be useful for defining the division polynomials when the characteristic of the selected field is at least 5 and the elliptic curve has the form $y^2 = x^3 + bx + c$:

$$\psi_1 = 1; \psi_2 = 2y; \psi_3 = 3x^4 + 6bx^2 + 12cx - b^2;$$

$$\psi_4 = 4y(x^6 + 5bx^4 + 20cx^3 - 5b^2x^2 - 4bcx - 8c^2 - b^3);$$

$$\psi_{2n+1} = \psi_{n+2}\psi_n^3 - \psi_{n-1}\psi_{n+1}^3 \text{ for } n \geq 2;$$

$$2y\psi_{2n} = \psi_n(\psi_{n+2}\psi_{n-1}^2 - \psi_{n-2}\psi_{n+1}^2) \text{ for } n \geq 3.$$

Given the integer $q = p^n$, where p is a prime number and n is an integer, an elliptic curve E defined over the field $\Phi_q$ and containing a finite number of points #(E) is said to be supersingular if |#(E)–(q+1)| is divisible by p.

The following explicit formulas will be useful for defining the division polynomials when the characteristic of the selected field is 2, the selected elliptic curve is not supersingular and has the form $y^2 + xy = x^3 + a_6$, and $a_6$ is a non-zero element of the field:

$$\psi_0; \psi_1 = 1; \psi_2 = x; \psi_3 = x^4 + x^3 + a_6; \psi_4 = x^6 + a_6x^2;$$

$$\psi_{2n+1} = \psi_n^3\psi_{n+2} + \psi_{n-1}\psi_{n+1}^3, n \geq 2;$$

$$x\psi_{2n} = \psi_{n-1}^2\psi_n\psi_{n+2} + \psi_{n-2}\psi_n\psi_{n+1}^2, n \geq 3.$$

The codes described above can be used wherever a block code is conventionally used. One possible application of our codes, for example, is for the encoding of short segments of information to be sent on the control channel of a wireless system between a mobile station and the network.

The codes that are described here lend themselves to a highly efficient method of error detection. As noted above, each of the codes described here may be understood as an ideal over a ring of polynomials. Therefore, a received codeword can be checked for error by determining whether it is an element of the ideal that corresponds to the code. Thus, error-detection is carried out by testing for ideal membership. Algorithms for testing for ideal membership are well-known. More specifically, it is known from the theory of Groebner bases that, given an ideal I having a Groebner basis G, a given polynomial will lie in I only if G divides the polynomial, with zero remainder. Standard algorithms are available for carrying out such a division. The pertinent theory of Groebner bases is described, for example, in the book by Cox cited above.

Given a code, the encoding and decoding of messages is readily performed using any conventional apparatus for encoding and decoding block codes. The computational steps involved in designing a code according to the methods described above are readily carried out using, by way of example and not of limitation, a digital computational device under the control of an appropriate software program.

What is claimed is:

1. A method for encoding data, comprising:
receiving from a communication medium and storing in a storage medium at least one message word; and
applying a transformation to the message word, thereby to produce a codeword, wherein the transformation comprises a linear mapping to a codeword derived from a division polynomial $\psi$ of an elliptic curve defined by a polynomial E, $\psi$ and E have coefficients taken from a finite field, $\psi$ and E generate a mathematical ideal I, the mapping is from message words to a quotient ring comprising bivariate polynomials modulo I, and wherein:
a) there is a correspondence that identifies each message word and each codeword with a unique polynomial having coefficients taken from the finite alphabet, said polynomials being referred to respectively as message polynomials and codeword polynomials;
b) the message word is selected from a finite set of said message polynomials;
c) the transformation is carried out such that each message word is mapped to a member of a finite set of codewords, said finite set being referred to as a code;
d) the polynomials that correspond to the code constitute a finite set of polynomials in two variables, said polynomials being referred to as codeword polynomials;
e) an addition and a multiplication operation are defined on the code such that any pair of codeword polynomials can be added or multiplied together as polynomials;
f) the result of adding together or multiplying together any pair of codeword polynomials is also a codeword polynomial; and
g) the multiplication operation is based on taking remainders after dividing by the polynomial E and after dividing by the polynomial $\psi$.

2. The method of claim 1, wherein the further polynomial $\psi$ is a division polynomial of the elliptic curve.

3. The method of claim 2, wherein the polynomials that correspond to the code are all multiples of one or more members of a generator set of polynomials, under said multiplication operation.

4. The method of claim 3, wherein the generator set consists of a polynomial which is a divisor of $\psi$.

5. The method of claim 2, wherein the elliptic curve has at least one $\mu$torsion point P, and the generator set consists of those polynomials that correspond to P and to one or more integer multiples of P.

6. The method of claim 1, wherein the finite alphabet constitutes a mathematical field.

7. The method of claim 1, wherein the finite alphabet constitutes a mathematical ring.

8. The method of claim 7, wherein the ring has q elements and has the algebraic structure of the integers modulo q.

9. A method, comprising:
receiving a block-coded communication;
recovering at least one received word from the communication; and
testing the received word for membership in a code consisting of a finite set of codewords, thereby to check for error in the received word, wherein:
a) there is a correspondence that identifies each codeword with a unique polynomial having coefficients taken from a finite alphabet, said polynomials being referred to as codeword polynomials;
b) the codeword polynomials constitute a finite set of polynomials in two variables;
c) an addition and a multiplication operation are defined on the code such that any pair of codeword polynomials can be added or multiplied together as polynomials;
d) the result of adding together or multiplying together any pair of codeword polynomials is also a codeword polynomial; and
e) the multiplication operation is based on taking remainders after dividing by polynomials E and $\psi$ having coefficients in the alphabet, wherein $\psi$ is a division polynomial of an elliptic curve defined by E, E and $\psi$ generate a mathematical ideal I, and the codeword polynomials belong to a quotient ring modulo I.

10. The method of claim 9, wherein the code constitutes a mathematical ideal over a mathematical ring, and the testing step comprises testing the received word for membership in the ideal.

* * * * *